United States Patent
Karp

(10) Patent No.: US 10,497,677 B1
(45) Date of Patent: Dec. 3, 2019

(54) ESD PROTECTION IN A STACKED INTEGRATED CIRCUIT ASSEMBLY

(71) Applicant: Xilinx, Inc., San Jose, CA (US)

(72) Inventor: James Karp, Saratoga, CA (US)

(73) Assignee: XILINX, INC., San Jose, CA (US)

( * ) Notice: Subject to any disclaimer, the term of this patent is extended or adjusted under 35 U.S.C. 154(b) by 51 days.

(21) Appl. No.: 15/429,112

(22) Filed: Feb. 9, 2017

(51) Int. Cl.
  *H01L 25/065* (2006.01)
  *H01L 27/02* (2006.01)
  *H01L 25/00* (2006.01)

(52) U.S. Cl.
  CPC ......... *H01L 25/0657* (2013.01); *H01L 25/50* (2013.01); *H01L 27/0255* (2013.01); *H01L 27/0288* (2013.01); *H01L 27/0292* (2013.01); *H01L 2225/06513* (2013.01); *H01L 2225/06517* (2013.01); *H01L 2225/06524* (2013.01); *H01L 2225/06527* (2013.01); *H01L 2225/06541* (2013.01); *H01L 2225/06568* (2013.01)

(58) Field of Classification Search
  CPC . H01L 23/5385; H01L 23/5223; H01L 23/66; H01L 23/49822; H01L 28/40; H01L 23/5222; H01L 23/642; H01L 24/16; H01L 25/0657; H01L 27/0688; H01L 25/0652; H03K 17/00; H05K 1/181; H05K 1/144; H05K 1/11; H02H 9/046; G01R 1/07378; G01R 1/36; H05F 3/02
  USPC .......... 324/750.14, 755.01; 361/220; 438/65
  See application file for complete search history.

(56) References Cited

U.S. PATENT DOCUMENTS

| | | | |
|---|---|---|---|
| 5,477,414 A | 12/1995 | Li et al. | |
| 5,489,866 A | 2/1996 | Diba | |
| 5,610,790 A | 3/1997 | Staab et al. | |
| 5,623,387 A | 4/1997 | Li et al. | |
| 5,689,133 A | 11/1997 | Li et al. | |
| 5,959,821 A | 9/1999 | Voogel | |
| 6,268,639 B1 | 7/2001 | Li et al. | |
| 6,569,576 B1 | 5/2003 | Hsueh et al. | |
| 6,645,802 B1 | 11/2003 | Li et al. | |
| 6,740,936 B1 | 5/2004 | Gitlin et al. | |
| 6,760,205 B1 | 7/2004 | Gaboury | |
| 6,972,939 B1 | 12/2005 | Ho et al. | |
| 6,978,541 B1 | 12/2005 | Feltner et al. | |
| 7,372,679 B1 | 5/2008 | Ho et al. | |
| 7,812,674 B2 | 10/2010 | Karp | |
| 7,872,346 B1 | 1/2011 | Chee et al. | |
| 8,134,813 B2 | 3/2012 | Karp et al. | |

(Continued)

*Primary Examiner* — Mouloucoulaye Inoussa
(74) *Attorney, Agent, or Firm* — Patterson + Sheridan, LLP

(57) ABSTRACT

An example integrated circuit (IC) assembly includes: a substrate, and a first IC die stacked on a second IC die, a stack of the first IC die and the second IC die mounted to the substrate. The first IC die includes an active side, a backside, a plurality of through-silicon vias (TSVs) exposed on the backside, an electrostatic discharge (ESD) circuit on the active side, and metallization on the active side. The metallization includes a first plurality of metal layers disposed on the active side and a second plurality of metal layers disposed on the first plurality of metal layers, each of the second plurality of metal layers thicker than each of the first plurality of metal layers. The metallization further includes a U-route that electrically couples a first TSV of the plurality of TSVs to the ESD circuit, the U-route including a conductive path through the second plurality of metal layers.

20 Claims, 4 Drawing Sheets

(56) References Cited

U.S. PATENT DOCUMENTS

| | | | |
|---|---|---|---|
| 8,174,112 | B1 | 5/2012 | Karp et al. |
| 8,181,140 | B2 | 5/2012 | Kireev et al. |
| 8,194,372 | B1 | 6/2012 | Chong et al. |
| 8,218,277 | B2 | 7/2012 | Li et al. |
| 8,384,225 | B2 | 2/2013 | Rahman et al. |
| 8,453,092 | B2 | 5/2013 | Kireev et al. |
| 8,560,982 | B2 | 10/2013 | Rahman |
| 8,618,648 | B1 | 12/2013 | Kwon et al. |
| 8,717,723 | B2 | 5/2014 | Kireev et al. |
| 8,742,477 | B1 | 6/2014 | Banijamali |
| 8,802,454 | B1 | 8/2014 | Rahman et al. |
| 8,866,229 | B1 | 10/2014 | Fakhruddin et al. |
| 8,881,085 | B1 | 11/2014 | Karp et al. |
| 8,947,839 | B2 | 2/2015 | Karp |
| 8,982,581 | B2 | 3/2015 | Karp et al. |
| 9,013,845 | B1 | 4/2015 | Karp |
| 9,099,999 | B1 * | 8/2015 | Wang ................ H03K 17/00 |
| 9,136,690 | B1 | 9/2015 | Upadhyaya et al. |
| 9,406,738 | B2 | 8/2016 | Kireev et al. |
| 2013/0187280 | A1 * | 7/2013 | Yuan ................ H01L 23/585 |
| | | | 257/773 |

* cited by examiner

ESD PROTECTION IN A STACKED INTEGRATED CIRCUIT ASSEMBLY

TECHNICAL FIELD

Examples of the present disclosure generally relate to semiconductor devices and, in particular, to electrostatic discharge (ESD) protection in a stacked integrated circuit (IC) assembly.

BACKGROUND

Integrated circuits (ICs) include circuitry for electrostatic discharge (ESD) protection. Currently, ESD routing provides a low resistive path from solder bumps on the IC package down to active circuitry on the semiconductor substrate of the IC. By design, the ESD routing is unidirectional from the solder bump down to the active circuitry, or from the active circuitry to the solder bump. An ESD discharge path readily allows for mitigation and avoidance of ESD current crowding.

Some IC packages include multiple IC dies on an interposer and/or package substrate. In one technique, multiple dies are stacked on each other (referred to as stacked IC assembly). With IC stacking, one IC die is electrically and mechanically mounted to another IC die, where one of the IC dies includes through-substrate vias (TSVs), The TSVs are exposed at a backside of the respective IC die and are thus subject to ESD events similar to exposed solder bumps. It is desirable to provide ESD protection in stacked IC packages while avoiding ESD current crowding.

SUMMARY

Techniques for electrostatic discharge (ESD) protection in a stacked integrated circuit (IC) assembly are described. In an example, an IC assembly includes: a substrate, and a first IC die stacked on a second IC die, a stack of the first IC die and the second IC die mounted to the substrate. The first IC die includes an active side, a backside, a plurality of through-silicon vias (TSVs) exposed on the backside, an electrostatic discharge (ESD) circuit on the active side, and metallization on the active side. The metallization includes a first plurality of metal layers disposed on the active side and a second plurality of metal layers disposed on the first plurality of metal layers, each of the second plurality of metal layers thicker than each of the first plurality of metal layers. The metallization further includes a U-route that electrically couples a first TSV of the plurality of TSVs to the ESD circuit, the U-route including a conductive path through the second plurality of metal layers.

In another example, an integrated circuit (IC) die includes: a substrate including an active side, a backside, a plurality of through-silicon vias (TSVs) exposed on the backside, an electrostatic discharge (ESD) circuit on the active side, and metallization on the active side; the metallization including a first plurality of metal layers disposed on the active side and a second plurality of metal layers disposed on the first plurality of metal layers, each of the second plurality of metal layers thicker than each of the first plurality of metal layers; and the metallization further including a U-route that electrically couples a first TSV of the plurality of TSVs to the ESD circuit, the U-route including a conductive path through the second plurality of metal layers.

In another example, a method of manufacturing an integrated circuit (IC) assembly includes: forming a first IC die having an active side, a backside, a plurality of through-silicon vias (TSVs) exposed on the backside, an electrostatic discharge (ESD) circuit on the active side; forming metallization on the active side of the first IC die, the metallization including a first plurality of metal layers disposed on the active side and a second plurality of metal layers disposed on the first plurality of metal layers, each of the second plurality of metal layers thicker than each of the first plurality of metal layers; and forming a U-route in the metallization, the U-route electrically coupling a first TSV of the plurality of TSVs to the ESD circuit, the U-route including a conductive path through the second plurality of metal layers.

These and other aspects may be understood with reference to the following detailed description.

BRIEF DESCRIPTION OF THE DRAWINGS

So that the manner in which the above recited features can be understood in detail, a more particular description, briefly summarized above, may be had by reference to example implementations, some of which are illustrated in the appended drawings. It is to be noted, however, that the appended drawings illustrate only typical example implementations and are therefore not to be considered limiting of its scope.

To facilitate understanding, identical reference numerals have been used, where possible, to designate identical elements that are common to the figures. It is contemplated that elements of one example may be beneficially incorporated in other examples.

DETAILED DESCRIPTION

Figure 1:
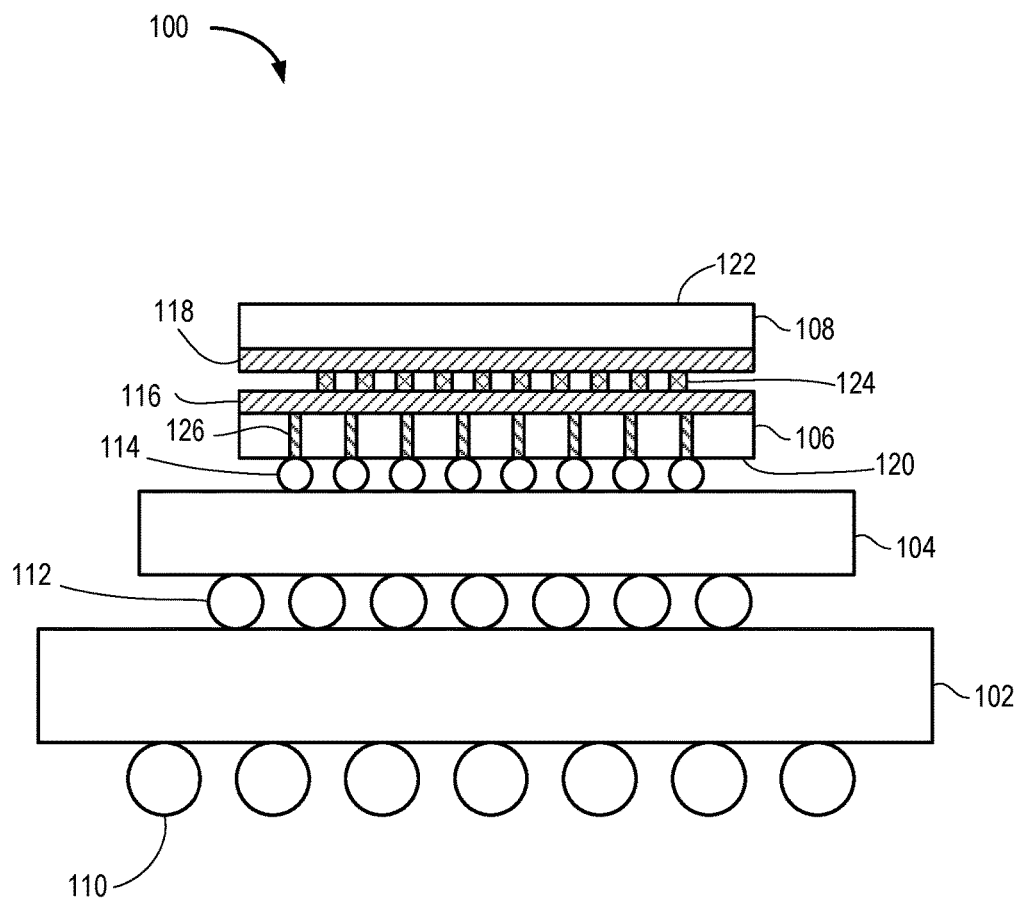
FIG. 1 is a cross-section view of a stacked IC assembly according to an example implementation.

Various features are described hereinafter with reference to the figures. It should be noted that the figures may or may not be drawn to scale and that the elements of similar structures or functions are represented by like reference numerals throughout the figures. It should be noted that the figures are only intended to facilitate the description of the features. They are not intended as an exhaustive description of the claimed invention or as a limitation on the scope of the claimed invention. In addition, an illustrated example need not have all the aspects or advantages shown. An aspect or an advantage described in conjunction with a particular example is not necessarily limited to that example and can be practiced in any other examples even if not so illustrated or if not so explicitly described.

Techniques for electrostatic discharge (ESD) protection in a stacked integrated circuit (IC) assembly are described. In examples, an integrated circuit (IC) assembly includes a substrate and a first IC die stacked on a second IC die. The stack of the first IC die and the second IC die is mounted to the substrate. The first IC die includes an active side, a backside, a plurality of through-silicon vias (TSVs) exposed on the backside, an electrostatic discharge (ESD) circuit on the active side, and metallization on the active side. The metallization includes a first plurality of metal layers disposed on the active side and a second plurality of metal layers disposed on the first plurality of metal layers, each of the second plurality of metal layers thicker than each of the first plurality of metal layers. The metallization further includes a U-route that electrically couples a first TSV of the plurality of TSVs to the ESD circuit, the U-route including a conductive path through the second plurality of metal layers.

In a stacked IC assembly, ESD current enters/exits an IC die via TSVs. The ESD current must follow a U-route in the metallization on the IC die, rather than a unidirectional route. U-routes that include horizontal conductive paths through metal layers near the substrate can be damaged by the ESD current. The thicker metal layers of the horizontal conductive path of a U-route can avoid damage to the ESD discharge path between an ESD element and a TSV. These and further aspects are described below with respect to the drawings.

FIG. 1 is a cross-section view of a stacked IC assembly 100 according to an example implementation. The stacked IC assembly 100 includes a package substrate 102, an interposer 104, an IC die 106, and an IC die 108. The IC die 108 is stacked on the IC die 106. The stacked combination of the IC die 106, 108 is mounted on the interposer 104. The interposer 104 is mounted on the package substrate 102. The IC dies 106, 108 are electrically connected to one another. The stacked combination of the IC die 106, 108 is electrically connected to the interposer 104. The interposer 104 is electrically connected to the package substrate 102. The package substrate 102 can be electrically connected to external substrates (e.g., a printed circuit board (PCB)).

The package substrate 102 can be any type organic substrate, inorganic substrate, or the like. The package substrate 102 includes a plurality of solder balls 110 that provide external electrical contacts for the stacked IC assembly 100. The interposer 104 can be any type of organic substrate, inorganic substrate, or the like. The interposer 104 includes a plurality of solder bumps 112 (e.g., C4 bumps). The package substrate 102 includes metallization (not shown) that electrically connects the solder balls 110 to the solder bumps 112. The IC dies 106, 108 can include a semiconductor substrate, such as silicon or the like. The IC die 106 includes a plurality of solder bumps (e.g., microbumps). The interposer 104 includes metallization (not shown) that electrically connects the solder bumps 112 to the solder bumps 114.

The IC die 106 further includes through-silicon vias (TSVs) 126 and an active side 116. The TSVs 126 extend between a backside 120 of the IC die 106 and the active side 116. The active side 116 includes active circuitry and metallization (shown in FIG. 2). The TSVs 126 electrically connect the solder bumps 114 to the active side 116. The IC die 108 further includes a backside 122 and an active side 118. The active side 118 includes active circuitry and metallization (not shown). The active side 116 is electrically coupled to the active side 118 by contacts 124, such as metal pillars, solder bumps, or the like.

In the example of FIG. 1, the IC die 108 is electrically and mechanically mounted to the IC die 106 by the contacts 124. The IC die 106 is electrically and mechanically mounted to the interposer 104 by the solder bumps 114. The interposer 104 is electrically and mechanically mounted to the package substrate 102 by the solder bumps 112. The package substrate 102 can be electrically and mechanically mounted to an external substrate (not shown), such as a PCB by the solder balls 110. The stacked IC assembly can include various other elements which have been omitted for clarity, such as underfills, a lid, and the like.

The stacked IC assembly 100 can also include other variations than the example shown in FIG. 1. In the example, the IC dies 106, 108 are stacked face-to-face (e.g., active side to active side). In other examples, the IC dies 106, 108 can be stacked face side to backside (e.g., the active side 118 of the IC die 108 can be mounted to the backside 120 of the IC die 106, and the active side 116 of the IC die 106 can be mounted on the interposer 104). In either example, the IC die 106 includes TSVs 126 to provide electrical pathways between the backside 120 and the active side 116. In another example, the interposer 104 can be omitted and the stacked combination of the IC die 106 and the IC die 108 can be mounted directly to the package substrate 102. In the example shown, the stacked IC assembly 100 includes two IC dies 106 and 108. However, the stacked IC assembly 100 can include more than two IC dies. For example, three or more IC dies can be mounted to form a single stack. In another example, multiple stacks of IC dies can be mounted on the interposer 104 in a side-by-side arrangement.

Electrical charge can build up at various interfaces between the substrates in the stacked IC assembly 100. For example, charge can accumulate on the solder balls 110, at the semiconductor substrate of the IC die 108, and at the internal nodes of the circuitry of the IC dies 106, 108. Such charges can discharge through the circuitry of the IC dies 106, 108 (referred to as electrostatic discharge (ESD)). Thus, the IC dies 106, 108 can include ESD protection circuitry therein to protect charge-sensitive circuitry from ESD. In particular, the IC die 106 can include ESD protection circuitry formed on the active side 116. The source of the charge and/or the electrical ground can be through TSVs 126 of the IC die 106. Thus, the IC die 106 includes "U-routes" in the metallization on the active side 116 to electrically connect given TSVs 126 to active circuitry formed in the semiconductor substrate. These U-routes are described further below with respect to FIG. 2.

Figure 2:
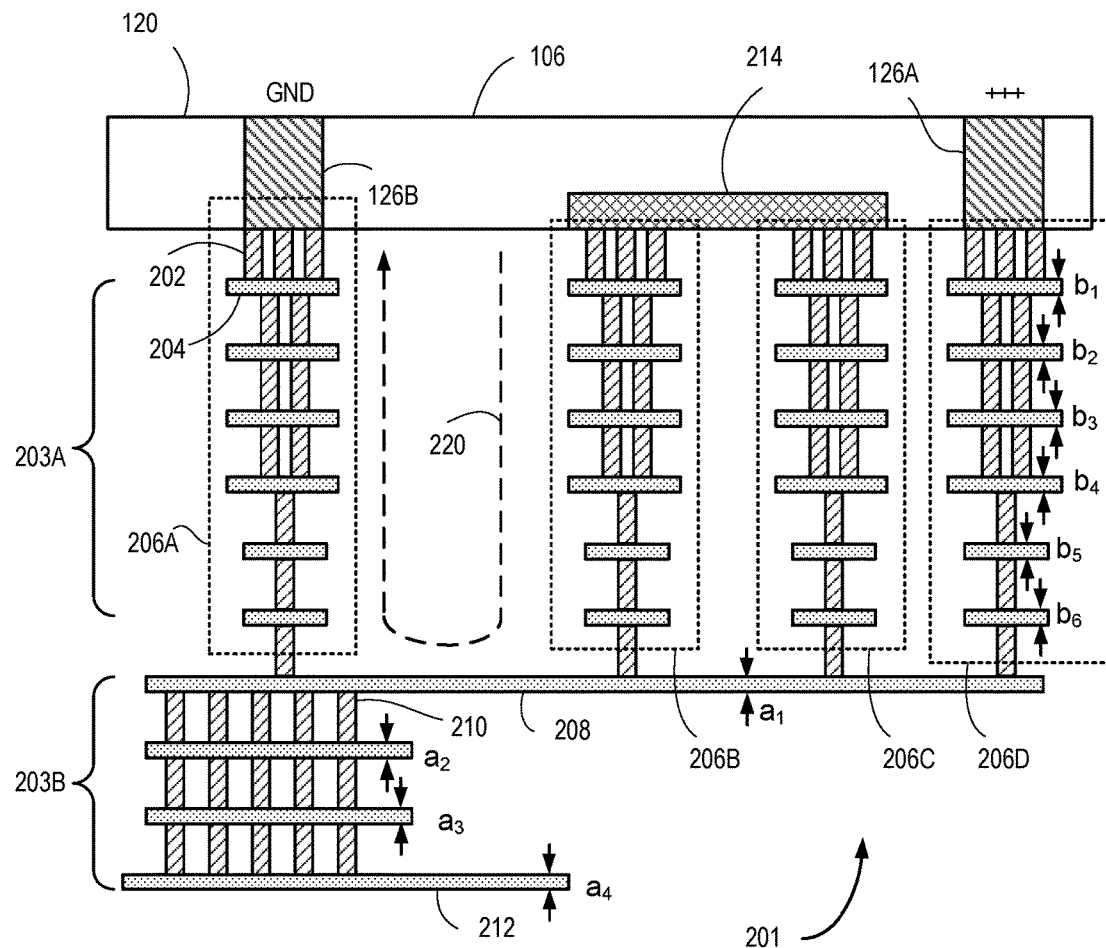
FIG. 2 is a cross-section showing a portion of the IC die in more detail according to an example.

FIG. 2 is a cross-section showing a portion of the IC die 106 in more detail according to an example. In the example of FIG. 2, the IC die 106 is rotated 180 degrees such that the backside 120 is at the top of the drawing and the active side 116 is at the bottom of the drawing. In the example, the IC die 106 includes TSVs 126A and 126B. The TSV 126A is electrically coupled to a positive source of charge (e.g., a solder ball on the package). The TSV 126B is electrically coupled to an electrical ground (e.g., another solder ball on the package). The IC die 106 includes ESD circuitry 214 formed in the semiconductor substrate (e.g., transistors, diodes, capacitors, etc.). The IC die 106 further includes metallization 201 formed on the active side 116 thereof. In general, the metallization 201 includes a first plurality of metal layers 203A and a second plurality of metal layers 203B. The first plurality of metal layers 203A is formed on the semiconductor substrate and is nearest the semiconductor substrate. The second plurality of metal layers 203B are formed on the first plurality of metal layers 203A and are farthest from the semiconductor substrate. In general, the metallization 201 can include any number of metal layers, and each plurality 203A and 203B can each include any number of metal layers. Further, in general, metal layers nearest the substrate of the IC die 106 are thinner than metal layers farther from the substrate of the IC die 106. Thus, the metal layers in the plurality of metal layers 203A are thinner than the metal layers in the plurality of metal layers 203B. The metallization 201 also includes dielectric material disposed between the metal layers, which is omitted for clarity.

In the example, the metallization 201 includes towers 206A, 206B, 206C, and 206D (generally towers 206). Each tower 206 is formed in the plurality of metal layers 203A (e.g., the thinner metal layers). Each tower 206 includes a vertical stack of vias 202 and metal segments 204. In the example, the tower 206D is electrically coupled to the TSV 126A. The tower 206A is electrically coupled to the TSV 126B. The towers 206B and 206C are electrically connected to the ESD circuitry 214.

In the example, the metallization 201 includes metal segments 208 and vias 210 formed in the plurality of metal layers 203B. The metal segments 208 are thicker than the metal segments 204 formed in the plurality of metal layers 203A. A metal segment 212 is the metal layer farthest from the substrate of the IC die 106 and is formed in the plurality of metal layers 203B. In the example, each of the towers 206 is electrically coupled to a metal segment 208 in the plurality of metal layers 203B.

In the example, the source and sink of current for an ESD discharge path are the TSVs 126A and 126B, respectively. Further, ESD protection circuitry (an example shown in FIG. 3) is formed in the circuitry 214. To protect charge-sensitive circuitry against ESD, the ESD discharge path must include the ESD protection circuitry in the circuitry 214. Thus, the metallization 201 includes U-routes for electrically connecting the TSVs 126A, 126B to the circuitry 214. In general, a U-route includes two vertical conductive paths (perpendicular to the IC die 106) and a horizontal conductive path (parallel with the IC die 106). One type of U-route includes a horizontal conductive path formed in the plurality of metal layers 203A (e.g., using the metal layer nearest the substrate of the IC die 106). While such a U-route is the shortest path, the horizontal conductive path is formed using thin metal segment(s), which can be damaged by the current of an ESD discharge. Thus, use of metal segments 204 for the horizontal conductive path of a U-route should be avoided. In the example, a U-route includes a horizontal conductive path formed using metal layer(s) of the plurality of metal layers 203B (e.g., thicker metal layers). Thus, the U-route includes two towers 206 for the vertical conductive paths and metal segments 208 for the horizontal conductive path. For example, a U-route 220 includes the tower 206B for one vertical conductive path, the metal segments 208 for the horizontal conductive path, and the tower 206A for the other vertical conductive path. Metal segment(s) 208 are further electrically coupled to the circuitry 214 through the towers 206B and 206C. Another U-route (not explicitly shown) is formed by the tower 206D, metal segment(s) 208, and the tower 206C. The U-routes electrically connect the TSVs 126A, 126B to the circuitry 214 and employ horizontal conductive paths that use the thicker metal segments, rather than thinner metal segments of the plurality of metal layers 203A. U-routes are used to avoid damage to the ESD discharge path that might otherwise occur if the ESD discharge path was routed directly from the ESD element to a TSV.

Figure 3:
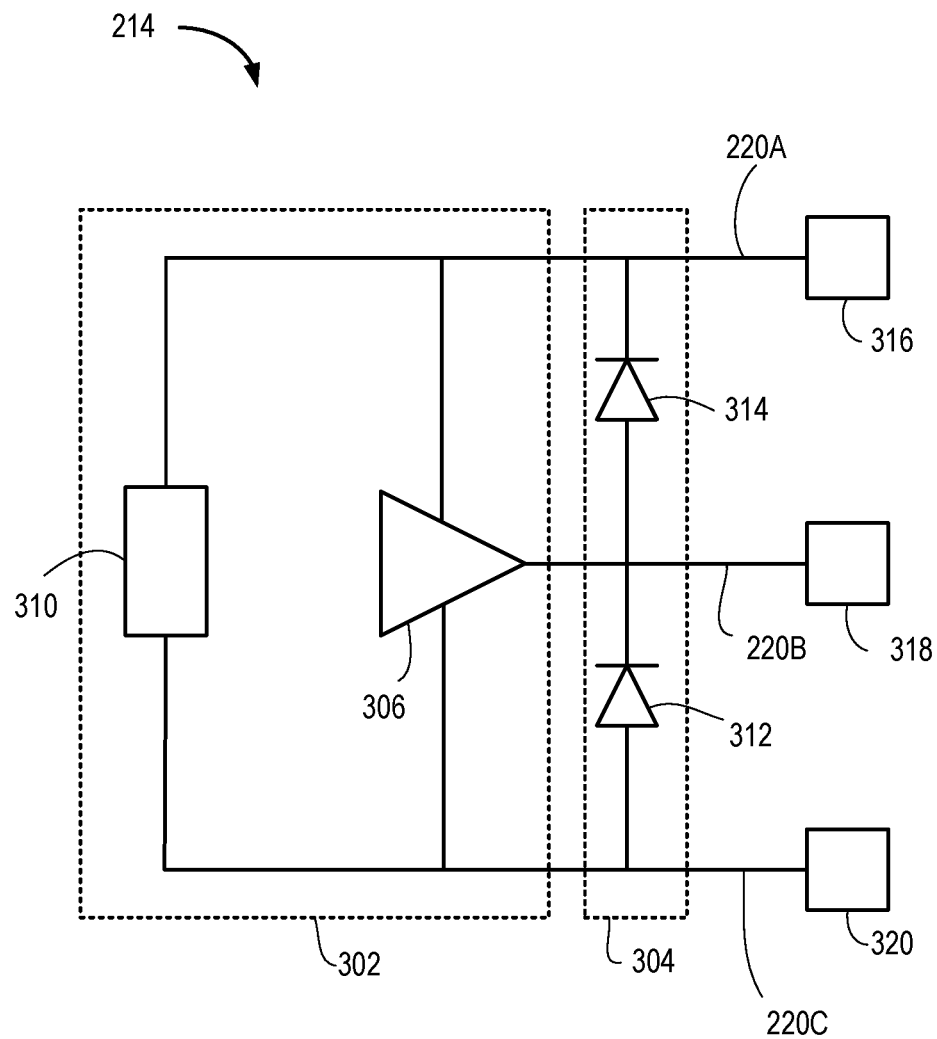
FIG. 3 is a schematic diagram depicting circuitry according to an example.

FIG. 3 is a schematic diagram depicting the circuitry 214 according to an example. The circuitry 214 includes a circuit 302 and ESD protection circuitry 304. The circuit 302 includes charge-sensitive circuitry 306 (e.g., a driver) and other circuitry 310 (e.g., an RC clamp). The ESD protection circuitry 304 includes a pair of diodes 312, 314. The circuitry 214 is coupled to TSVs 316, 318, and 320 using U-routes 220A, 220B, and 220C, respectively. An anode of the diode 314 is coupled to the TSV 328 through the U-route 220B. A cathode of the diode 314 is coupled to the TSV 316 through the U-route 220A. An anode of the diode 312 is coupled to the TSV 320 through the U-route 220C. A cathode of the diode 312 is coupled to the TSV 318 through the U-route 220B. The charge-sensitive circuitry 306 is electrically coupled to each of the TSVs 316, 318, and 320. For example, the TSVs 316 and 320 may be voltage sources (e.g., VDD and VSS, respectively), and the TSV 318 may be a signal source. The circuitry 214 shown in FIG. 3 is merely exemplary. Various types of ESD protection circuitry can be employed that protect various types of charge-sensitive circuitry. The TSVs can be coupled to the circuitry 214 using any number of U-routes, as shown in FIG. 2.

Figure 4:
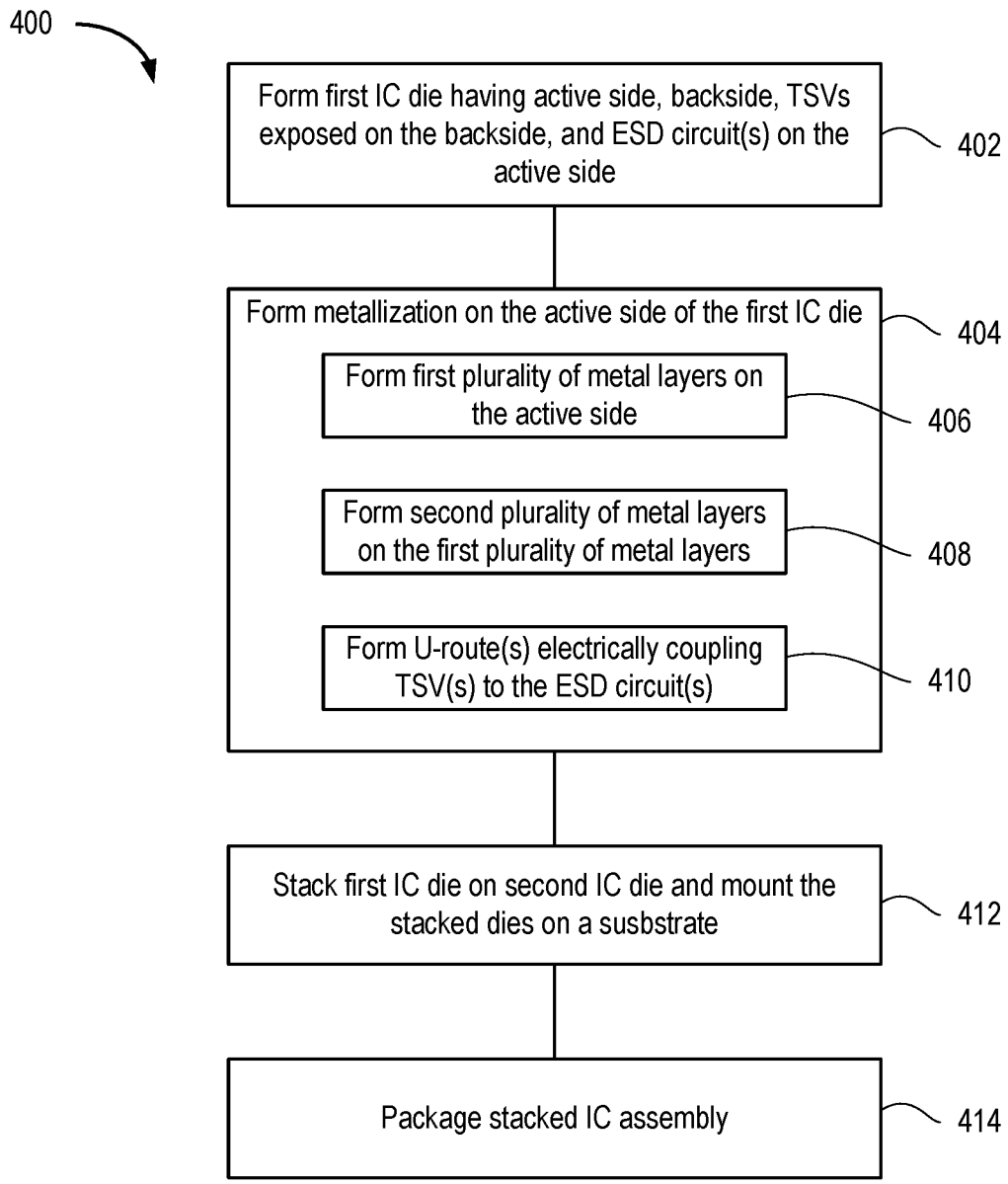
FIG. 4 is a flow diagram depicting a method of manufacturing a semiconductor assembly according to an example.

FIG. 4 is a flow diagram depicting a method of manufacturing a semiconductor assembly according to an example. The method 400 can be performed by one or more semiconductor manufacturing tools. At step 402, the tool(s) form a first IC die having an active side, a backside, TSVs exposed on the backside, and ESD circuit(s) on the active side. For example, FIG. 2 shows an example IC die 106 having TSVs 126 and ESD circuit 214.

At step 404, the tool(s) form metallization on the active side of the first IC die. At step 406, the tool(s) form a first plurality of metal layers on the active side of the first IC die. For example, FIG. 2 shows the plurality of metal layers 203A formed on the IC die 106. At step 408, the tool(s) form a second plurality of metal layers on the first plurality of metal layers. For example, FIG. 2 shows the plurality of metal layers 203B formed on the plurality of metal layers 203A. As described above, each of the second plurality of metal layers (e.g., metal layers in 203B having thicknesses $a_1$, $a_2$, $a_3$ and $a_4$) are thicker than each of the plurality of first metal layers (e.g., metal layers 203A having thicknesses $b_1$, $b_2$, $b_3$, $b_4$, $b_5$ and $b_6$ less than thicknesses $a_1 \ldots a_4$). At step 410, the tool(s) form U-route(s) electrically coupling TSV(s) to the ESD circuit(s). For example, FIG. 2 shows a U-route 220 that electrically couples a TSV 126B to the ESD circuit 214. Each U-route includes a conductive path through the second plurality of metal layers (e.g., the plurality of metal layers 203B).

At step 412, the tool(s) stack the first IC die on a second IC die and mount the stacked dies on a substrate. For example, FIG. 1 shows a die 108 stacked on the die 106 having U-route(s) as shown in FIG. 2. At step 414, the tool(s) can package the IC assembly. For example, the stacked dies 106, 108 can be mounted to an interposer 104, which is in turn mounted to the package substrate 102.

Techniques for electrostatic discharge (ESD) protection in a stacked integrated circuit (IC) assembly have been described. In a stacked IC assembly, ESD current enters/ exits an IC die via TSVs. The ESD current must follow a U-route in the metallization on the IC die, rather than a unidirectional route. U-routes that include horizontal conductive paths through metal layers near the substrate can be damaged by the ESD current. In examples described herein, U-routes include horizontal conductive paths through metal layers that are farther form the substrate and that are thicker than the metal layers near the semiconductor substrate. The U-routes include vertical towers between the TSV/circuitry and the horizontal conductive path. The thicker metal layers of the horizontal conductive path of a U-route can avoid damage to the ESD discharge path between an ESD element and a TSV.

While the foregoing is directed to specific examples, other and further examples may be devised without departing from the basic scope thereof, and the scope thereof is determined by the claims that follow.

What is claimed is:
1. An integrated circuit (IC) assembly, comprising:
a substrate; and a first IC die stacked on a second IC die, a stack of the first IC die and the second IC die mounted to the substrate;

the first IC die including an active side, a backside, a plurality of through-silicon vias (TSVs) exposed on the backside, an electrostatic discharge (ESD) circuit on the active side, and metallization disposed directly on the active side;

the metallization including a first plurality of metal layers disposed on the active side and a second plurality of metal layers disposed on the first plurality of metal layers, each of the second plurality of metal layers thicker than each of the first plurality of metal layers;

the metallization further including a U-route that electrically couples a first TSV of the plurality of TSVs to the ESD circuit, the U-route including a conductive path through the second plurality of metal layers.

2. The IC assembly of claim 1, wherein the conductive path of the U-route includes a first conductive path from the first TSV through the first plurality of metal layers to the second plurality of metal layers, a second conductive path in the second plurality of metal layers, and a third conductive path from the second plurality of metal layers through the first plurality of metal layers to the ESD circuit.

3. The IC assembly of claim 2, wherein the first conductive path comprises a first vertical tower and the third conductive path comprises a second vertical tower, the first and second vertical towers perpendicular to the active side.

4. The IC assembly of claim 3, wherein the second conductive path comprises lateral routing in the second plurality of metal layers, the lateral routing parallel to the active side.

5. The IC assembly of claim 1, wherein the backside of the first IC die is mechanically and electrically coupled to the substrate.

6. The IC assembly of claim 5, wherein the substrate includes a plurality of solder balls electrically coupled to the plurality of TSVs of the first IC die.

7. The IC assembly of claim 1, wherein the second IC die includes a plurality of solder bumps electrically coupled to the metallization of the first IC die.

8. An integrated circuit (IC) die, comprising:
a substrate including an active side, a backside, a plurality of through-silicon vias (TSVs) exposed on the backside, an electrostatic discharge (ESD) circuit on the active side, and metallization disposed directly on the active side;

the metallization including a first plurality of metal layers disposed on the active side and a second plurality of metal layers disposed on the first plurality of metal layers, each of the second plurality of metal layers thicker than each of the first plurality of metal layers; and the metallization further including a U-route that electrically couples a first TSV of the plurality of TSVs to the ESD circuit, the U-route including a conductive path through the second plurality of metal layers.

9. The IC die of claim 8, wherein the conductive path of the U-route includes a first conductive path from the first TSV through the first plurality of metal layers to the second plurality of metal layers, a second conductive path in the second plurality of metal layers, and a third conductive path from the second plurality of metal layers through the first plurality of metal layers to the ESD circuit.

10. The IC die of claim 9, wherein the first conductive path comprises a first vertical tower and the third conductive path comprises a second vertical tower, the first and second vertical towers perpendicular to the active side.

11. The IC die of claim 10, wherein the second conductive path comprises lateral routing in the second plurality of metal layers, the lateral routing parallel to the active side.

12. The IC die of claim 8, further comprising a plurality of solder bumps electrically coupled to the metallization.

13. A method of manufacturing an integrated circuit (IC) assembly, comprising:
forming a first IC die having an active side, a backside, a plurality of through-silicon vias (TSVs) exposed on the backside, and an electrostatic discharge (ESD) circuit on the active side;

forming metallization directly on the active side of the first IC die, the metallization including a first plurality of metal layers disposed on the active side and a second plurality of metal layers disposed on the first plurality of metal layers, each of the second plurality of metal layers thicker than each of the first plurality of metal layers; and forming a U-route in the metallization, the U-route electrically coupling a first TSV of the plurality of TSVs to the ESD circuit, the U-route including a conductive path through the second plurality of metal layers.

14. The method of claim 13, further comprising:
stacking the first IC die on a second IC die and mounting a stack of the first IC die and the second IC die on a substrate.

15. The method of claim 14, wherein the conductive path of the U-route includes a first conductive path from the first TSV through the first plurality of metal layers to the second plurality of metal layers, a second conductive path in the second plurality of metal layers, and a third conductive path from the second plurality of metal layers through the first plurality of metal layers to the ESD circuit.

16. The method of claim 15, wherein the first conductive path comprises a first vertical tower and the third conductive path comprises a second vertical tower, the first and second vertical towers perpendicular to the active side.

17. The method of claim 16, wherein the second conductive path comprises lateral routing in the second plurality of metal layers, the lateral routing parallel to the active side.

18. The method of claim 14, wherein the backside of the first IC die is mechanically and electrically coupled to the substrate.

19. The method of claim 18, wherein the substrate includes a plurality of solder balls electrically coupled to the plurality of TSVs of the first IC die.

20. The method of claim 14, wherein the second IC die includes a plurality of solder bumps electrically coupled to the metallization of the first IC die.

* * * * *